United States Patent [19]
Alexander

[11] 3,728,530
[45] Apr. 17, 1973

[54] BINARY TO DECIMAL CONVERTER CIRCUIT

[75] Inventor: George Sheppard Alexander, Tempe, Ariz.

[73] Assignee: Motorola Inc., Franklin Park, Ill.

[22] Filed: Mar. 13, 1972

[21] Appl. No.: 234,386

Related U.S. Application Data

[63] Continuation of Ser. No. 79,092, Oct. 8, 1970, abandoned.

[52] U.S. Cl. .............235/155, 307/203, 340/347 DD
[51] Int. Cl. ..........................G08c 5/00, H03k 19/08
[58] Field of Search ...............................340/347 DD; 235/92 EA, 155; 307/203, 237, 238, 219

[56] References Cited

UNITED STATES PATENTS

| | | | |
|---|---|---|---|
| 3,304,548 | 2/1967 | Klinikowski | 235/92 EA |
| 3,309,695 | 3/1967 | Klinikowski | 340/347 DD |
| 3,504,363 | 3/1970 | Klinikowski | 340/347 DD |
| 3,506,816 | 4/1970 | Klinikowski | 340/347 DD |
| 3,535,497 | 10/1970 | Byrne | 235/155 |
| 3,601,626 | 8/1971 | Harks-Heide | 307/203 |

*Primary Examiner*—Thomas A. Robinson
*Attorney*—Mueller & Aichele

[57] ABSTRACT

A circuit for changing binary to decimal numbers is disclosed in which the driver transistor for the display device breaks down in an avalanche mode at a higher voltage than similar prior art circuits and in which threshold antinoise means and an improved transistor biasing means are included.

15 Claims, 1 Drawing Figure

PATENTED APR 17 1973
3,728,530
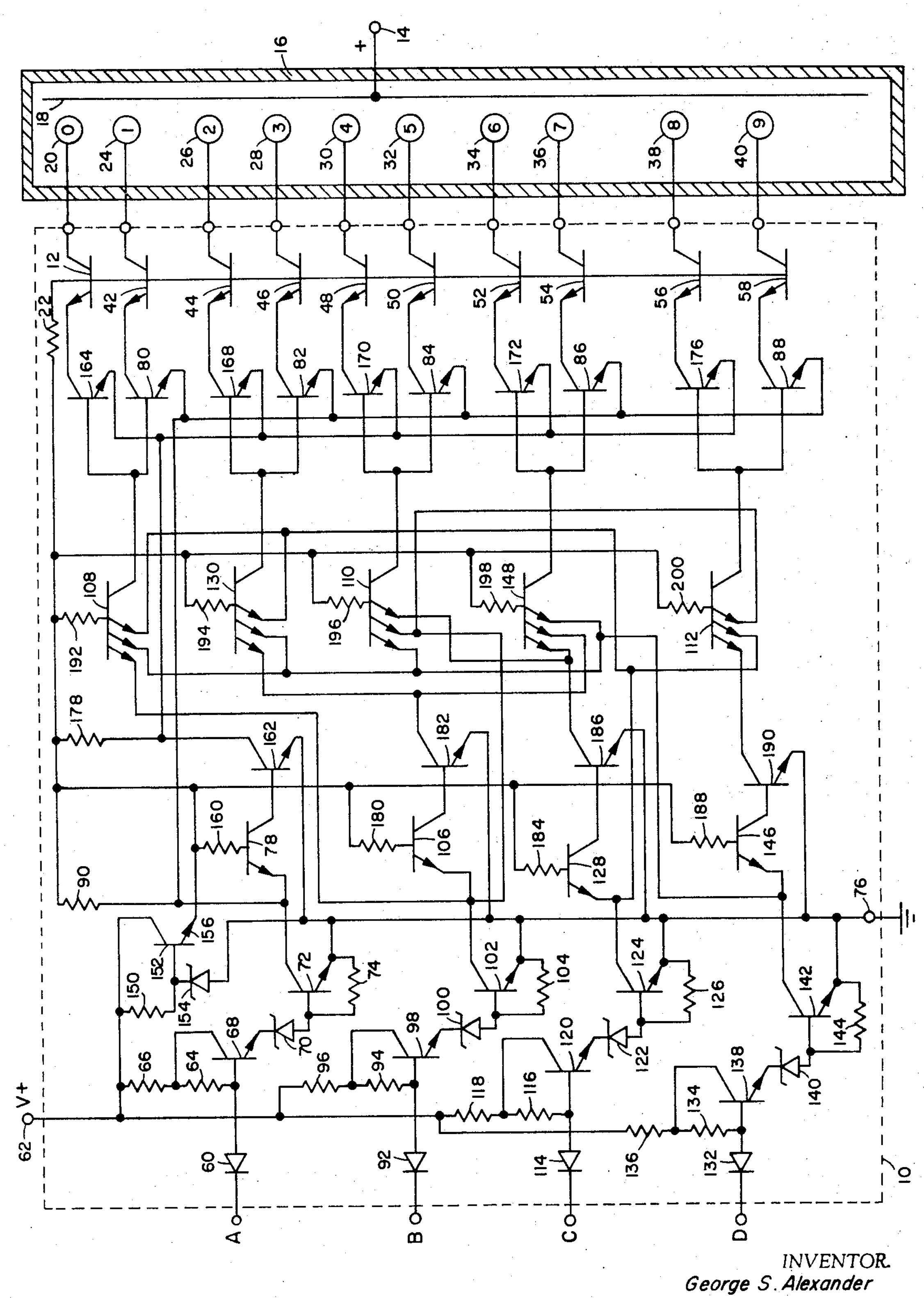
INVENTOR.
George S. Alexander
BY
Mueller & Aichele
ATTY'S.

BINARY TO DECIMAL CONVERTER CIRCUIT

This application is a continuation of Ser. No. 79,092, filed Oct. 8, 1970 and now abandoned.

BACKGROUND

In prior art devices where binary ones and zeroes are applied to input connections and the equivalent decimal numeral or digit is displayed, and the display device is operated by one or more power transistors, if for any reason the power transistor breaks down, it stays broken down after the voltage causing breakdown disappears, that is, the power transistor latches up. While a power transistor drive for a display device that does not latch up, is disclosed in the Lee and Hively application, Ser. No. 868,989, filing date Oct. 24, 1969, and assigned to Motorola, Inc., in the Lee et al. circuit, the voltage swing on the power transistor that causes breakdown thereof is the value of the breakdown voltage built into the transistor, whereby the voltage swing applied to this Lee et al circuit is limited by this built-in breakdown voltage. Furthermore, the prior art binary decimal converter circuits may give false indication. For example, if binary numbers that are greater than the highest decimal digit of the display are applied to the such known converters, an improper display will result. In addition, the binary to decimal converters of the prior art are so sensitive to electrical noise, giving a false display at a low noise level, as to limit the usefulness thereof. In addition, such prior art converters include transistor biasing circuits whose operation is not fully satisfactory.

SUMMARY

According to the invention, the bases of the power transistors whose collectors are connected to the display tube are connected such that the voltage swing causing the power transistor to break down is increased by the base potential of the transistor, and furthermore, the logic of the converter circuit is so arranged that certain higher binary numbers that should not operate the decimal display are inhibited from so doing. In addition, an electrical noise threshold device is provided to reduce the response of the converter of this invention to noise and an improved bias means which is independent of input voltage is included for biasing the transistors comprising the described converter.

It is an object of this invention to provide an improved binary to decimal converter circuit.

DESCRIPTION

The invention will be better understood upon reading the following description in connection with the accompanying drawing in which The sole FIGURE illustrates a binary to decimal converter including the features of this invention.

As shown in the FIGURE, if binary zeroes are applied to each of the A, B, C and D inputs to the chip 10, only the NPN power transistors 12, 164, and 162 will be conductive in the collector to base mode thereof, providing a current path from the high voltage positive terminal 14 of the gas filled display tube 16, to the anode 18, through the gas in the tube 16, and to the cathode electrode 20 and through the collector to emitter path of the transistor 12, the collector to emitter path of a transistor 164, the collector to emitter path of a transistor 162 to ground, lighting up the decimal zero associated with the electrode 20. With other binary inputs, other electrodes 24 to 40 are lighted up, lighting up their respective decimal displays 1 to 9. In each case, a base current for one of the power transistors 12 and 42 to 58 flows in the bias resistor 22, whereby less than the whole voltage appearing at the electrodes 20 and 24 to 40 is applied to the power transistors 12 and 42 to 58.

If any other four digit binary number (equal to 10 to 15, for example) is applied to the terminals A, B, C and D, then no one of the cathodes 20, 24, 26, 28, 30, 32, 34, 36, 38 or 40 will be lighted up as will be shown. Other features of this invention are also described below.

While the complete binary to decimal converter, including the power transistors 12 and 42 to 52, as well as the bias resistor 22 therefor, is shown on a chip 10, it may be advantageous to supply separate power transistors and a base resistor therefor which are not on the chip 10.

The converter circuit will be described and then its operation will be described. Since all the transistors used are NPN, the type of the transistor will not be further mentioned in this description. The input terminal A is connected to the cathode of a diode 60. The anode of the diode 60 is connected to a positive supply terminal 62 for the chip 10 by way of two resistors 64 and 66 in series. The anode of the diode 60 is also connected to the base of a transistor 68. The collector of the transistor 68 is connected to the junction of the resistors 64 and 66. The emitter of the transistor 68 is connected to the cathode of a zener diode 70 whose anode is connected to the base of a transistor 72. The emitter of the transistor 72 is connected to its base by way of a resistor 74. The emitter of the transistor 72 is connected to ground terminal 76 of the chip. The collector of the transistor 72 is connected to the emitter of transistors 78, 80, 82, 84, 86 and 88. The collector of the transistor 72 is also connected through a resistor 90 and a resistor 22 to the bases of all the power transistors 12 and 42 to 58.

The input terminal B is connected to the cathode of a diode 92. The anode of the diode 92 is connected through two resistors 94 and 96 in series to the terminal 62 and to the base of an NPN transistor 98. The collector of the transistor 98 is connected to the junction of the resistors 94 and 96. The emitter of the transistor 98 is connected to the cathode of a zener diode 100. The anode of the diode 100 is connected to the base of a transistor 102. The base and emitter of the transistor 102 are connected together by way of a resistor 104. The emitter of the transistor 102 is connected to ground 76. The collector of the transistor 102 is connected to the emitter of a transistor 106, to the first emitter of a three emitter transistor 108, to the second emitter of a three emitter transistor 110, and to the third emitter of a three emitter transistor 112.

The input terminal C is connected to the cathode of a diode 114. The anode of the diode 114 is connected through resistors 116 and 118 in series to the terminal 62. The anode of the diode 114 is also connected to the base of a transistor 120 whose collector is connected to the junction of the resistors 116 and 118. The emitter of the transistor 120 is connected to the cathode of a zener diode 122. The anode of the diode 122 is connected to the base of a transistor 124, and through a resistor 126 to the emitter thereof and to ground 76. The collector of the transistor 124 is connected to the emitter of a transistor 128, to the second emitter of the transistor 112, to the third emitter of a three emitter transistor 130 and to the third emitter of the transistor 108.

The input terminal D is connected to the cathode of a diode 132. The anode of the diode 132 is connected to the terminal 62 by way of two resistors, 134 and 136 in series, and to the base of a transistor 138 whose collector is connected to the junction of the resistors 134 and 136. The emitter of the transistor 138 is connected to the cathode of a zener diode 140. The anode of the diode 140 is connected to the base of a transistor 142, and through a resistor 144 to the emitter of the transistor 142 and to ground 76. The collector of the transistor 142 is connected to the emitter of a transistor 146, to the third emitter of a three emitter transistor 148, to the first emitter of the transistor 110, to the second emitter of the transistor 130 and to the second emitter of the transistor 108.

The voltage supply terminal 62 is connected through a resistor 150 to the base of a transistor 152 and directly to the collector thereof. The base of the transistor 152 is connected to the cathode of a zener diode 154 whose anode is connected to ground 76. The emitter 156 of the transistor 152 is connected to the junction of the resistors 90 and 22. As will be explained, the transistor 152, the resistor 150 and the zener diode 154 produce bias current for several of the transistors in the described circuit, the bias current flowing from the emitter 156 of the transistor 152.

The base of the transistor 78 is connected to the emitter 156 by way of a bias resistor 160. The collector of the transistor 78 is connected to the base of a transistor 162. The collector of the transistor 162 is connected to the emitters of transistors 164, 168, 170, 172 and 176 and through a resistor 178 to the junction of the resistors 90 and 22. The emitter of the transistor 162 is connected to ground 76.

The base of the transistor 106 is connected to the emitter 156 through a resistor 130. The collector of the transistor 106 is connected to the base of a transistor 182. The emitter of the transistor 182 is grounded to terminal 76 and the collector of transistor 182 is connected to the first emitter of the transistor 130 and to the second emitter of the transistor 148.

The base of the transistor 128 is connected to the emitter 156 through a resistor 184. The collector of the transistor 128 is connected to the base of a transistor 186 whose emitter is connected to ground terminal 76. The collector of the transistor 186 is connected to the first emitter of the transistor 148 and the third emitter of the transistor 110.

The base of the transistor 146 is connected to the emitter 156 through a resistor 188. The collector of the transistor 146 is connected to the base of a transistor 190 whose emitter is connected to ground 76. The collector of the transistor 190 is connected to the first emitter of the transistor 112.

The bases of the transistors 108, 130, 110, 148 and 112 are connected by way of respective resistors 192, 194, 196, 198 and 200 to the junction of the resistors 90 and 22. The collector of the transistor 108 is connected to the bases of the transistors 164 and 80. The collector of the transistor 130 is connected to the bases of the transistors 168 and 82. The collector of the transistor 110 is connected to the bases of the transistors 170 and 84. The collector of the transistor 148 is connected to the bases of the transistors 172 and 86. The collector of the transistor 112 is connected to the bases of the transistors 176 and 88.

The collectors of the transistors 164, 80, 168, 82, 170, 84, 172, 86, 176, and 88 are connected respectively to the emitters of the power transistors 12, 42, 44, 46, 48, 50, 52, 54, 56 and 58. The collectors of the power transistors 12 and 42 to 58 are connected respectively to the electrodes 20 and 24 to 40 of the gas filled display tube 16.

When a sufficiently large, positive supply voltage is applied to the terminal 62 with respect to the ground terminal 76, and the input diode 60 is either floating (unconnected) or is biased at a potential sufficiently large so as not to draw any current through the diode 60, current flows through the resistors 66 and 64, the base to emitter path of the transistor 68, through the zener diode 70, the resistors 74 and base to emitter of transistor 72 to ground 76, breaking down the zener diode 70 and the base-emitter junction of transistor 72. The emitter of the transistor 68 is negative with respect to the base by the forward voltage between the base and the emitter of the transistor, and the collector is positive with respect to the base by the drop in the resistor 64, causing the transistor 68 to be conductive, and to respond to input potential applied thereto from the terminal A by way of the diode 60. Similarly, the zeners 100, 122 and 140 and the base-emitter junctions of transistors 102, 124 and 142 are broken down and the transistors 98, 120 and 138 become conductive and respond to input voltages applied to their bases.

Current flows from the positive terminal 62 through the resistor 150 and breaks down the zener 154 in flowing to ground 76. A constant voltage which is independent of the voltage at the terminal 62 is therefore applied to the base of the transistor 152 and the collector of the transistor 152 is positive with respect to the base thereof by the voltage drop in the resistor 150. The base to emitter voltage is essentially constant and the transistor 152 does not saturate (that is, the base to collector junction does not become forward biased), and the current flow out of the emitter 156 of the transistor 152 is whatever the supplied circuitry demands.

In the circuit as shown, the transistors 108, 130, 110, 148 and 112 act as AND gates having three inputs and the transistors 164, 80, 168, 82, 170, 84, 172, 86, 176 and 88 act as inverting AND gates or NAND gates, while the pairs of transistors 68 and 72, 98 and 102, 120 and 124, 138 and 142, 78 and 162, 106 and 182, 128 and 186, and 146 and 190 act as phase inverters.

Let it be assumed that a binary number 0000 is applied to the input terminals D, C, B and A respectively. Under these conditions, the transistors 12, 164 and 162 and only the transistors 12, 164 and 162 should be conductive whereby the cathode 20 lights up exhibiting a decimal zero.

When a high or positive potential is applied to the terminal A, B, C or D, this high potential being a binary 1, this high potential is stopped by the respective diodes 60, 92, 114 or 132 to which it is applied, and the respective transistor 68, 98, 120 or 138 is and remains conductive, rendering the transistors 72, 102, 124 or 142 respectively also conductive. When the low potential, comprising a binary zero, is applied to the terminals A, B, C or D, the respective transistors 68 and 72, 98 and 102, 120 and 124 or 138 and 142 are rendered nonconductive. This is due to the fact that the application of a low potential or binary 0 to the terminals A, B, C or D clamps the base of the respective transistor 68, 98, 120 or 138 to a voltage so low that the respective transistor cannot conduct.

When current flows out of any one or more of the three emitters of a three emitter transistor 108, 130, 110, 148 or 112, no base to collector current is available. This collector current, when it flows, is base current for other transistors.

A transistor 80 to 88 and 164 to 176 or any one of them cannot become conductive until base current is available therefor and also until a path is provided for the emitter thereof. Therefore, the availability of base current only or the supplying of an emitter path only for the transistors 80 to 88 and 164 to 176 will not make that transistor conductive.

With these operations of the several elements in mind, let it be assumed that a four digit binary zero, 0000, is applied to the terminals D, C, B and A respectively. Then the transistors 68, 72, 98, 102, 120, 124, 138 and 142 are all nonconductive whereby a high potential appears on the collector of the transistor 72 due to the resistor 90 and no emitter path exists for the transistors 80, 82, 84, 86 or 88 and no electrode 24, 28, 32, 36 or 40 can light up, whereby no odd decimal number can be displayed. Since the transistor 102 is blocked, no current can flow from the first emitter of the transistor 108 or from the second emitter of the transistor 110 or from the third emitter of the transistor 112. Since the transistor 124 is blocked, no current can flow from the third emitter of the transistors 108 or 130 or the second emitter of the transistor 112. Since the transistor 142 is blocked, there can be no current flow from the second emitter of the transistors 108 and 130, the first emitter of the transistor 110 or the third emitter of the transistor 148. Since all three of the emitters of the transistor 108 are blocked, base current for the transistors 164 and 80 is available from the collector of the transistor 108. It has been shown that there is no emitter path for the transistor 80 so this transistor cannot conduct. However, there is a path for the emitter current of the transistor 164 through the collector to emitter circuit of the transistor 162 to ground 76, due to the fact that base current flows to the transistor 162 from the collector of transistor 78 when the transistors 68 and 72 are nonconductive. Therefore, the electrode 20 lights up and the display device 16 shows a decimal zero. However, the transistor 162 being conductive also provides an emitter path for each of the transistors 168, 170, 172 and 176 besides providing a path for the emitter of the transistor 164. Since the transistor 182 is conductive because of the base current provided from the collector of transistor 106, current flows from the first emitter of the transistor 130 and the second emitter of the transistor 148 whereby no base current flows to the transistors 168 and 172 and the decimals 2 and 6 cannot light up. Since the transistor 186 is conductive because of the base current provided from the collector of transistor 128, the third emitter of the transistor 110 and the first emitter of the transistor 148 supply current, whereby there is no base current available for the transistor 170, whereby the decimal 4 cannot light up. Since the transistor 190 is conductive because of the base current provided from the collector of transistor 146, current flows from the first emitter of the transistor 112, preventing flow of base current to the transistor 176 and preventing lighting up of the decimal 8. Therefore, when all of the binary inputs are zero, the decimal zero in the tube 16 is displayed.

Let us now assume that the binary number 1001, which is equal to decimal 9, is applied to the terminals D, C, B and A respectively. The transistors 68 and 72, 138 and 142, 106 (base to collector), and 182, 128 (base to collector) and 186 are conductive and the transistors 98 and 102, 120 and 124, 78 (base to collector) and 162, 146 (base to collector) and 190 are nonconductive. The transistor 72 being conductive provides an emitter path for the transistors 80, 82, 84, 86 and 88 corresponding to the odd decimal numbers 1, 3, 5, 7, and 9. The transistor 162 being nonconductive prevents there being an emitter path for the transistors 164, 168, 170, 172 and 176 corresponding to the decimal zero and the even numbers 2, 4, 6 and 8, whereby a zero or an even number cannot be displayed by the tube 16. Due to transistor 142 being conductive, current flows out of the second emitter of the transistor 108 whereby there is no base current for transistor 80 and so the decimal 1 cannot be displayed. Due to transistor 182 being conductive, current flows out of the first emitter of the transistor 130 whereby there is no base current for the transistor 82 and the decimal 3 cannot be displayed. Due to transistor 186 being conductive, current flows out of the third emitter of the transistor 110 whereby there is no base current for the transistor 84 and the decimal 5 cannot be displayed. Current also flows out of the first emitter of the transistor 148 whereby the decimal 7 cannot be displayed. No current flows out of the first, second or third emitter of the transistor 112 since they are connected respectively to the collectors of the blocked transistors 190, 124 and 102. Base current is provided for the transistor 88 which has an emitter path as described above and the decimal 9 is displayed. Similar analysis of the circuit with other binary inputs equal to 1 to 8 will show that the corresponding decimal digit is displayed by the tube 16.

Now let it be assumed that 1010 is applied to the input terminals D, C, B and A respectively. Such an input should not cause any display. With such an input, the transistors 68, 72, 120, 124, 106 (base to collector), 182, 146 (base to collector) and 190 are nonconductive and transistors 98, 102, 138, 142, 78 (base to collector), 162, 128 (base to collector), and 186 are conductive, The odd numbers cannot be displayed since the transistor 72 is not conductive, whereby an emitter path for the transistors corresponding to the odd displays is not available. The zero cannot be displayed since current flows from the first emitter of the transistor 108 due to transistor 102 being conductive. The 2 cannot be displayed since the transistor 142 being conductive draws current from the second emitter of the transistor 130. The 4 cannot be displayed since the transistor 142 being conductive draws current from the first emitter of the transistor 110. The 6 cannot be displayed since the transistor 186 being conductive draws current from the first emitter of the transistor 148 and the 8 cannot be displayed since the transistor 102 being conductive draws current from the third emitter of the transistor 112. Therefore, when a binary 10 is applied to the inputs A, B, C and D, there will be no display, avoiding errors. Similarly, it will be seen that no binary number having four digits, and which is greater than 9, can cause a display in the tube 16.

As noted above, the disclosed converter, when it fails due to the application of a breakdown voltage to the collector of one or more of the power transistors 12, 42, 44, 46, 48, 50, 52, 54, 56 and 58, this transistor breaks down in the collector to base mode which does not result in a latch-up as would be the case if the power transistor broke down in a collector to emitter mode. That is, when the breakdown is in the collector to emitter mode, it takes less voltage to keep the transistor broken down than it takes to break it down, whereby a large decrease in collector voltage is required to restore the transistor to its nonbroken down operation when the breakdown is in a collector to emitter mode. In a circuit as shown, the power transistors 12 and 42 to 58, if they break down, break down in the collector to base mode, where a slight decrease in the collector voltage permits the transistors 12 and 42 to 58 to operate properly. Furthermore, in the inventive showing, the bases of the power transistors 12 and 42 to 58 are connected to a low potential point by way of the resistor 22 whereby the voltage that is necessary to break down a power transistor 12 or 42 to 58 is increased by the common base potential of the output devices 12, and 42 to 58.

The base potential on the power transistors 12 and 42 to 58 are always equal since all the bases thereof are connected together. Two cases may be described. In the first case a binary number corresponding to one of the decimal numbers 0–9 is applied to the input terminals A, B, C and D whereby one of the transistors 12 and 42 to 58 is conductive. If the number is a binary zero, then the transistor 12 is conductive and the common base potential is equal to the voltage between the emitter and base of the transistor 12 plus the collector to emitter voltage at saturation of the transistor 164, plus the collector to emitter voltage at saturation of the transistor 162. When upon application of a binary 1 to the terminals A, B, C, and D, the transistor 42 is conductive, the collector to emitter voltage at saturation of the transistor 80 is added to the collector to emitter voltage of the transistor 72 at saturation and to the collector to base voltage of the transistor 42 to obtain the common base potential of the transistors 12 and 42 to 58. These voltages depend on the design of several transistors involved and may total about 1.3 volts. The other case is when binary numbers corresponding to the decimal numbers 10 to 15 are applied to the input terminals A, B, C and D. Then no emitter current path for the transistors 12 and 42 to 58 is available and no current flows through the current limiting resistor 22 and the base potential of the transistors 12 and 42 to 58 rises to the voltage of the emitter 156, which may be about 6 volts. This base potential plus the built-in breakdown potential between the collector and the base of the transistors 12 and 42 to 48 must be exceeded to cause breakdown of these transistors.

The bias circuit comprising the transistor 152, the resistor 150 and the zener diode 154 provides a constant bias voltage at the emitter 156 for all the transistors 78, 106, 128, 146, 108, 130, 110, 148, 112, 12 and 42 to 58, this bias voltage being affected very little by changes in supply voltage applied to the terminal 62.

The antinoise feature of the disclosed converter is a result of the circuit shown including the diodes 60, 92, 114 and 132, the offset zener diodes 70, 100, 122 and 140 and the base to emitter voltage drops of transistors 68 and 72, 98 and 102, 120 and 124, and 138 and 142. From the "0" logic level on any input no positive going voltage can activate the transistors 68, 98, 120, or 138 until the positive going voltage equals or exceeds the threshold voltage of the input. From the logic "1" level no negative going voltage can deactivate the transistors 68, 98, 120, or 138 until the negative going voltage equals or falls below the threshold voltage of the input.

The threshold of input A is established by the sum of the base to emitter voltage drops of the transistors 68 and 72, the cathode to anode voltage drop of zener diode 70, minus the forward voltage drop of the input diode 60. The thresholds of the other inputs B, C, and D are established in the same manner.

An input pulse of a certain magnitude and of a duration long enough to overcome the delay in the diodes 60, 92, 114 and 132 and in the transistors 68, 98, 120 and 138 as well as in the zener diodes 70, 100, 122 and 140 is required to activate or deactivate any of the transistors 68, 98, 120, or 138. Therefore, noise with a smaller magnitude and duration will have no effect on the circuit.

What is claimed is:

1. A binary decimal converter comprising:

a plurality of input terminals to which a binary number may be applied, a plurality of diodes, each of said input terminals being connected to the cathode of a respective diode, a first plurality of NPN transistors each having an emitter, a collector and a base, the anodes of said diodes being connected to respective bases of said first plurality of transistors, a plurality of zener diodes, a plurality of second transistors having collectors, emitters and bases, a connection between the emitters of said first plurality of transistors to the bases of respective transistors of said second plurality of transistors by way of respective zener diodes, means to render said first and second transistors and said zener diodes conductive, a display device having at least a first and a plurality of second electrodes, a first plurality of power transistors each having an emitter, a collector and a base, connections between a second electrode and a collector of respective power transistors, a constant voltage biasing current source, means to directly connect said bases of said first power transistors to each other, a resistor, means to connect said bases of said first power transistors to said constant voltage source through said resistor, a second plurality of power transistors having collectors, emitters and bases, respective connections between the emitters of said first power transistors to the collectors of said second power transistors, a third plurality of transistors each having a base, a collector and a plurality of emitters, a connection between the base of at least one of said second plurality of power transistors to the collector of one of said transistors having a plurality of emitters, a connection between the emitter of at least one of said second plurality of power transistors to the collector of a transistor of said second plurality of transistors, and means to connect a collector of at least one of said second plurality of transistors to at least one emitter of a plural emitter transistor.

2. A binary to decimal converter comprising:

a plurality of input terminals to which binary numbers may be applied, a first plurality of pairs of transistors, means including respective ones of said terminals for rendering said transistors of a pair thereof either conductive or non-conductive, a second plurality of pairs of transistors, means for so coupling a pair of transistors of the first plurality thereof to a respective pair of transistors of a second pair thereof that the coupled pairs have opposite states of conductivity, a display device having a plurality of terminals, a plurality of power transistors each having an emitter and a collector, means for connecting the collector of a power transistor to a respective terminal of said display device and, means to provide an emitter current path for said power transistors including a transistor of one of said pairs of transistors.

3. A display device having input means for receiving digital data in the form of bi-level electronic signals and having output display means with a first contact connected to a first voltage source, and a plurality of second contacts, for selectively displaying a decimal representation of the digital data comprising:

a. first inverting means having input means for receiving and inverting the electronic signals, and having output means;

b. second inverting means having output means, and having input means connected to the output means of the first inverting means for receiving and inverting the once inverted electronic signals to effectively provide the bi-level electronic signals, not inverted, at the output means of the second inverting means;

c. gating means, having output means, and having input means connected to the output means of the first and second inverting means, to be selectively activated;

d. switching means, connected to the output means of the first and second inverting means and the output means of the gating means, to be selectively opened and closed; and e. a plurality of output transistors, each having collector, base and emitter, the collector of each being connected to a respective one of the second contacts of the output display means, the emitter of each being connected to the switching means and the base of each being connected together to a bias voltage source, to provide conduction in one selected output transistor, thereby selectively displaying the decimal representation.

4. The display device of claim 3 wherein the input means further comprises four terminals, each to receive a bi-level electronic signal designated, respectively, A, B, C and D.

5. The display device of claim 4 wherein the first inverting means further comprise four high-threshold-sensitivity inverting stages each connected to a respective one of the four input terminals of the display device to produce respectively, inverted signals designated $\overline{A}$, $\overline{B}$, $\overline{C}$ and $\overline{D}$, and wherein the second inverting stages, each connected to a respective one of the four first inverting stages produce, respectively, signals designated A, B, C and D.

6. The display device of claim 3 wherein the output display means further comprise 10 discrete gas discharge display positions, each for being singly and selectively activated to provide, respectively, a decimal digit from 0 to 9.

7. The display of claim 6 wherein the plurality of output transistors comprises one output transistor associated with each of the 10 gas discharge positions.

8. The display device of claim 7 wherein the switching means further comprise:

d. (i) 10 switching transistors each having collector, base and emitter, the collector of each being connected to the emitter f a respective one of the output transistors, and the emitters of five of the switching transistors being connected together to the output means of the first inverting means, and the emitters of the other five switching transistors being connected together to the output means of the second inverting means, and having each base connected to the output means of the gating means.

9. The display device of claim 8 wherein the input means further comprise four terminals, each to receive a bi-level electronic signal designated, respectively, A, B, C and D.

10. The display device of claim 9 wherein the first inverting means further comprise four high-threshold-sensitivity inverting stages each connected to a respective one of the four input terminals of the display device to produce respectively, inverted signals designated $\overline{A}$, $\overline{B}$, $\overline{C}$ and $\overline{D}$, and wherein the second inverting means further comprise four inverting stages, each connected to a respective one of the four first inverting stages to produce, respectively, signals designated A, B, C and D.

11. The display device of claim 10 wherein the gating means further comprise five gates logically combining the output means of the first and second inverting means to produce, respectively, signals designated $\overline{B}\,\overline{C}\,\overline{D}$, $B\,\overline{C}\,\overline{D}$, $\overline{B}\,C\,\overline{D}$, $B\,C\,\overline{D}$, and $\overline{B}\,\overline{C}\,D$.

12. The display device of claim 11 wherein the switching transistors are logically connected to the output means of the first and second inverting means in the gating means to produce respectively, signals designated $\bar{A}\,\bar{B}\,\bar{C}\,\bar{D}$, $A\,\bar{B}\,\bar{C}\,\bar{D}$, $\bar{A}\,B\,\bar{C}\,\bar{D}$, $A\,B\,\bar{C}\,\bar{D}$, $\bar{A}\,\bar{B}\,C\,\bar{D}$, $A\,\bar{B}\,C\,\bar{D}$, $\bar{A}\,B\,C\,\bar{D}$, $A\,B\,C\,\bar{D}$, $\bar{A}\,\bar{B}\,\bar{C}\,D$, and $A\,\bar{B}\,\bar{C}\,D$.

13. A display device comprising:

a. output display means having a first and a second contact, the first contact being connected to a first voltage source;

b. an output transistor having a collector, base and emitter, its collector being connected to the second contact of the output display means and its base being connected to a bias voltage source; and c. switching means, connected between a second voltage source and the emitter of the output transistor, for activating the output display means providing a current path, when closed, from the first voltage source through the output display means, through the collector-emitter of the output transistor to the second voltage source, and for deactivating the output display means, when opened, by opening the emitter of the output transistor to present only a collector-to-base avalanche path to the output display means.

14. The display device of claim 13 wherein the display means further comprise a gas discharge display tube.

15. The display device of claim 14 wherein the switching means further comprise:

c. (i) a switching transistor having a collector, base and emitter, the collector being connected to the emitter of the output transistor, and the emitter being connected to the second voltage source; and (ii) switch control means connected to the base of the switching transistor for selectively causing the switching transistor to turn on to provide a current path for the emitter of the output transistor.

* * * * *